(12) United States Patent
Geva et al.

(10) Patent No.: US 11,775,730 B2
(45) Date of Patent: Oct. 3, 2023

(54) HIERARCHICAL LARGE BLOCK SYNTHESIS (HLBS) FILLING

(71) Applicant: International Business Machines Corporation, Armonk, NY (US)

(72) Inventors: Ofer Geva, Poughkeepsie, NY (US); Brittany Duffy, Rochester, MN (US); Timothy A. Schell, Cary, NC (US); Eduard Herkel, New York, NY (US); Jesse Peter Surprise, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 297 days.

(21) Appl. No.: 17/402,806

(22) Filed: Aug. 16, 2021

(65) Prior Publication Data

US 2023/0052310 A1    Feb. 16, 2023

(51) Int. Cl.
*G06F 30/392* (2020.01)
*G06F 30/398* (2020.01)
*G06F 30/394* (2020.01)

(52) U.S. Cl.
CPC .......... *G06F 30/398* (2020.01); *G06F 30/392* (2020.01); *G06F 30/394* (2020.01)

(58) Field of Classification Search
CPC ........ G06F 30/30; G06F 30/39; G06F 30/398; G06F 30/392; G06F 30/394
USPC ........................................................ 716/139
See application file for complete search history.

(56) References Cited

U.S. PATENT DOCUMENTS

| | | |
|---|---|---|
| 6,467,074 B1 | 10/2002 | Katsioulas et al. |
| 7,137,094 B2 | 11/2006 | Tien |
| 7,260,803 B2 | 8/2007 | Lakshmanan et al. |
| 7,334,207 B2 | 2/2008 | Preuthen et al. |
| 7,661,078 B1 | 2/2010 | Noice et al. |
| 7,683,403 B2 | 3/2010 | Tripathi |
| 8,015,522 B2 | 9/2011 | Wang et al. |
| 8,214,774 B2 | 7/2012 | Nardone et al. |
| 8,446,176 B1 | 5/2013 | Yang et al. |
| 9,953,121 B2 | 4/2018 | Datta et al. |
| 10,970,440 B2 | 4/2021 | Chiu et al. |
| 2004/0230933 A1* | 11/2004 | Weaver, Jr. ............. G06F 30/39 716/122 |
| 2019/0138682 A1 | 5/2019 | Correale, Jr. et al. |
| 2022/0058326 A1* | 2/2022 | Lee ....................... G06F 30/392 |

* cited by examiner

*Primary Examiner* — Paul Dinh
(74) *Attorney, Agent, or Firm* — CANTOR COLBURN LLP; Kelsey M. Skodje

(57) ABSTRACT

Aspects of the invention include a computer-implemented method of hierarchical large block synthesis (HLBS). At least a partial ring is created around an HLBS structure. The partial ring includes at least one or more of filler elements, which are engineering change order (ECO) books for adding repeaters to wire dominated nets, and decoupling capacitors of relatively large sizes. Certain areas of the HLBS structure within the partial ring that exhibit a unique characteristic are identified. Decoupling capacitors of the relatively large sizes are disposed in the certain areas. A remainder of the areas of the HLBS structure are filled with engineering change order (ECO) books and decoupling capacitors of relatively small sizes.

20 Claims, 5 Drawing Sheets

HIERARCHICAL LARGE BLOCK SYNTHESIS (HLBS) FILLING

BACKGROUND

The present invention generally relates to hierarchical large block synthesis (HLBS) and more specifically, to a method of HLBS filling to allow for increased engineering change order opportunities.

The process of creating an integrated circuit (IC), referred to as very large scale integration (VLSI) or chip design, includes many steps, some of which are repeated iteratively. Generally, combinational logic gates and memory elements (i.e., latches, flip-flops) are integrated into a process referred to as logic synthesis to implement the desired functionality of the IC. One of the results of the logic synthesis is a netlist that defines the connectivity among the various logic gates and memory elements that make up the IC.

This logic synthesis is ultimately transitioned into a layout of physical components in an arrangement that considers the timing, congestion, and power usage constraints of the IC design. Processes that are performed iteratively as part of this transition from the logic design to the physical layout are referred to as physical synthesis. Physical synthesis includes placement (i.e., defining the location of cells), clock and timing optimization (i.e., ensuring that timing constraints are met based on the location of cells and the resulting wire lengths of interconnects), and routing (i.e., defining paths for the wires interconnecting cells). The goal of physical synthesis is to generate a layout that meets timing, congestion, and power metrics. Once synthesized, a given child macro can be flattened into a higher-level unit (sometimes referred to as the parent level), which allows the placements and routing connections of the flattened child macro to be considered when performing parent optimization.

SUMMARY

Embodiments of the present invention are directed to a computer-implemented method of hierarchical large block synthesis (HLBS).

A non-limiting example includes creating at least a partial ring around an HLBS structure. The partial ring includes at least one or more filler elements, which are engineering change order (ECO) books for adding repeaters to wire dominated nets, and decoupling capacitors of relatively large sizes. Certain areas of the HLBS structure within the partial ring that exhibit a unique characteristic are identified. Decoupling capacitors of the relatively large sizes are disposed in certain areas. The rest of the areas of the HLBS structure are filled with engineering change order (ECO) books and decoupling capacitors of relatively small sizes.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
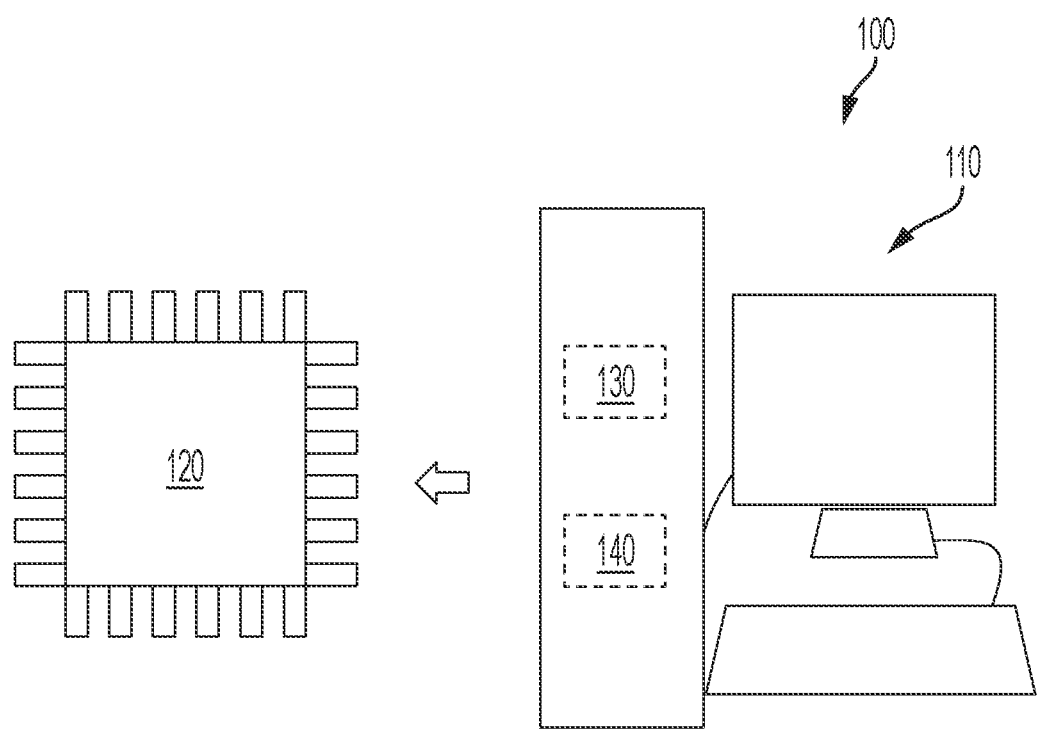
FIG. 1 illustrates a system to perform a computer-implemented method of chip design in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide for a new fill routine that includes certain distinct operations. In the first operation, a ring is created around a hierarchical large block synthesis (HLBS), which will be treated as integration, and which will be filled with fill buffer elements (FILLBUFFs), which are special engineering change order (ECO) books intended for adding repeaters to wire dominated nets that are only needed in certain areas, and relatively large decoupling capacitors (DECAP), or special DECAPs. This ring will thus have relatively little logical area. By default, the ring width can be about 50 um depending on design size and features. In the second operation, special DECAPs are added in critical voltage (IR) sensitive areas in the HLBS within the ring. The rest of the design of the HLBS is filled with ECO books and relatively small DECAPs in different density combinations to allow for a spread that is not boundary oriented and offers improved ECO options around logical macros. This solution addresses design needs and ECO flexibility, which are crucial for a successful HLBS design.

Current microprocessor trends are integrating traditionally custom designs with random logic macros (RLMs) into very large integrated circuit designs. In some cases, entire microprocessor units are designed using an automated synthesis flow that integrates these traditional custom designs and RLMs. This type of merged synthesis run is referred to as large block synthesis (LBS). The LBS blocks, i.e., sets of cells or logic modules, require handling dataflow designs differently than traditional RLMs. In this process, the entire logic is usually flattened out, and timing-critical logic portions can be pre-optimized in order to improve the overall result. This pre-optimization uses multiple copies (instances) of the same block of logic whose cells have already been placed and routed. These hard-bounded blocks are fed into the flat synthesis.

HLBS is a particular type of LBS and involves performing a 2-step process that transforms a unit into a synthesized super-large block. First, macros are synthesized and then a unit integration level is synthesized, eventually flattening the macros. The placement of child logic circuit components (i.e., logic circuit components placed in child macros at the child level as opposed to the higher parent level) is generally predetermined based on slack and pin location.

HLBS is typically a design (ranging from around 500 k to around 2M "nets") that is built with synthesis tools in which RLM fill steps usually account for RLM-style engineering change order ECO requirements. These ECO requirements are logical ECO books, which tend to be spread around existing logic, and DECAP books, which usually end up around the macro or HLBS edge where the HLBS is less dense. This can lead to problematic voltage (IR) drops in certain portions of the HLBS where insufficient numbers of DECAPs are provided, ECO books not being spread properly in logical areas, and a lack of integration style fullers to drive long or high wires.

One or more embodiments of the present invention address one or more of the above-described shortcomings of the prior art by providing for HLBS. At least a partial ring is created around an HLBS structure to include at least one or more filler elements and decoupling capacitors of relatively large sizes. Certain areas of the HLBS structure within the partial ring that exhibit a unique characteristic are identified. Decoupling capacitors of the relatively large sizes are disposed in certain areas. The rest of the areas of the HLBS structure are filled with ECO books and decoupling capacitors of relatively small sizes.

FIG. 1 is a block diagram of a system 100 to perform a computer-implemented method of updating branch prediction according to embodiments of the invention. The system 100 includes processing circuitry 110 used to generate the design that is ultimately fabricated into an integrated circuit 120. The steps involved in the fabrication of the integrated circuit 120 are well-known and briefly described herein. Once the physical layout is finalized, according to embodiments of the invention, to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 9.

Figure 2:
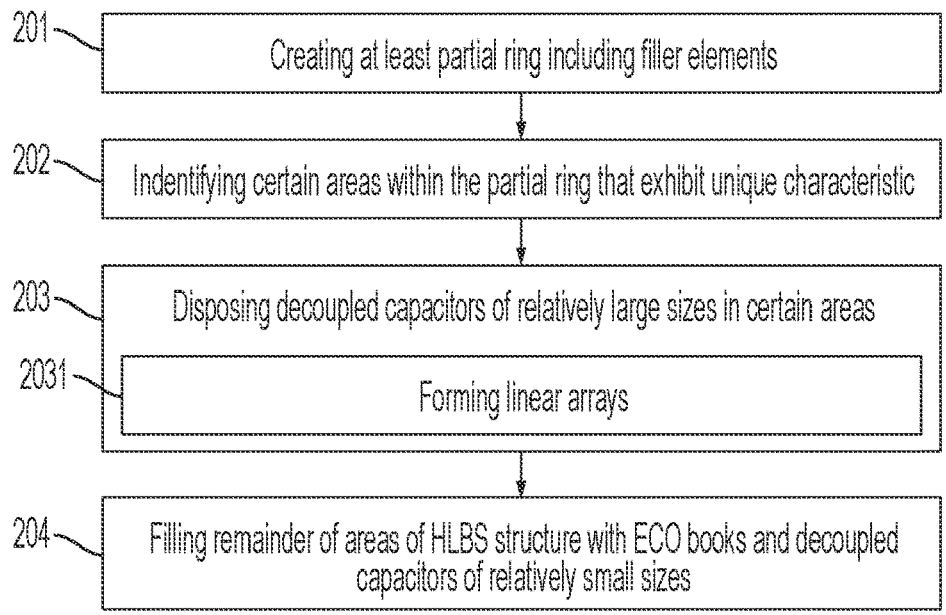
FIG. 2 is a flow diagram illustrating a computer-implemented method of hierarchical large block synthesis (HLBS) in accordance with one or more embodiments of the present invention.

With reference to FIG. 2, a computer-implemented method of hierarchical large block synthesis (HLBS) is provided and includes creating at least a partial ring around an HLBS structure to comprise at least one or more of filler elements, which are engineering change order (ECO) books for adding repeaters to wire dominated nets, and decoupling capacitors of relatively large sizes (201) and identifying certain areas of the HLBS structure within the partial ring that exhibit a unique characteristic (202), such as having or exhibiting a voltage (IR) or a critical voltage (IR) sensitivity. In addition, the method can include disposing decoupling capacitors of the relatively large sizes in the certain areas (203) and filling the rest of the areas of the HLBS structure with engineering change order (ECO) books and decoupling capacitors of relatively small sizes (204). In accordance with one or more embodiments of the present invention, the decoupling capacitors of the relatively large sizes can be about 0.96 μm×0.648 μm or larger, and the decoupling capacitors of the relatively small sizes can be about 0.96 μm×0.324 μm. Also, in accordance with one or more further embodiments of the present invention, the disposing of the decoupling capacitors of the relatively large sizes in the certain areas of operation 203 can include forming linear arrays of the decoupling capacitors of the relatively large sizes (2031). These linear arrays can extend from and between opposite sides of the partial ring.

Although the description above refers to linear arrays of decoupling capacitors, it is to be understood that this is not required and that other embodiments are possible. For example, the linear arrays of the decoupling capacitors can be arranged in vertical, horizontal or diagonal parallel lines, they can crisscross with one another, they can have angular or curved sections, they can be annular or polygonal shapes, they can extend in two or three dimensions, etc.

Figure 3:
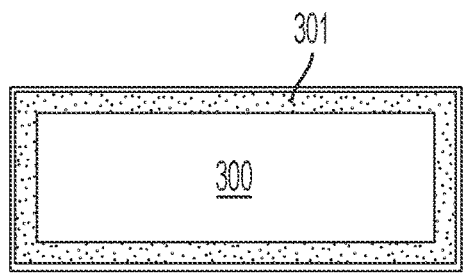
FIG. 3 is a top-down view of an HLBS structure with a full ring of filler elements and decoupling capacitors in accordance with one or more embodiments of the present invention.
Figure 4:
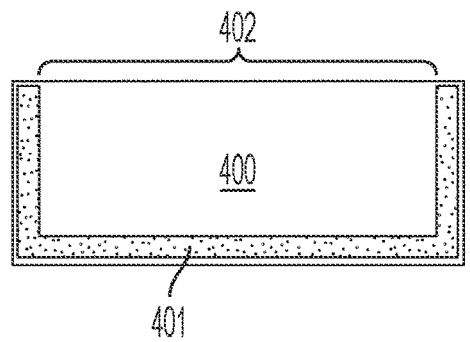
FIG. 4 is a top-down view of an HLBS structure with a partial, U-shaped ring of filler elements and decoupling capacitors in accordance with one or more embodiments of the present invention.
Figure 5:
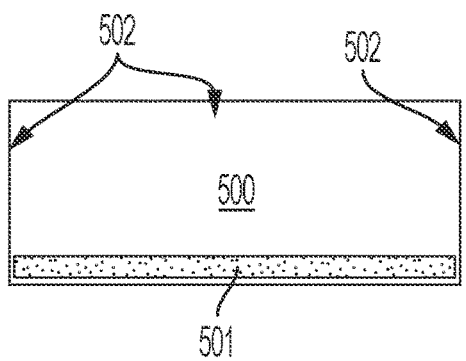
FIG. 5 is a top-down view of an HLBS structure with a line of filler elements and decoupling capacitors in accordance with one or more embodiments of the present invention.

With reference to FIGS. 3-5 and in accordance with one or more embodiments of the present invention, the creating of at least the partial ring of operation 201 can include one or more of creating a full ring 301 around the HLBS structure 300 with no open lengths or sections (see FIG. 3), creating a U-shape 401 partially around the HLBS structure 400 with an open length or sections 402 (see FIG. 4) and creating a line 501 or lines 501 partially around or along a section of the HLBS structure 500 with one or more open lengths or sections 502 (see FIG. 5). The U-shape 401 can, of course, be considered an upside-down U-shape, a C-shape or a reverse C-shape depending on the perspective of the observer. In any case, whether the full ring 301, the U-shape 401 or the line 501 is formed depends on a structure and configuration of the HLBS structure 300/400/500 (i.e., where macros extend to an edge of the HLBS structure with no signals coming in or out). However, for the purposes of clarity and brevity, the following description will relate to the case in which the creating of at least the partial ring of operation 201 includes the creation of the full ring 301 around the HLBS structure 300 as shown in FIG. 3.

Although the description above refers to the full ring 301, the U-shaped ring 401 and the line 501, it is to be understood that other embodiments are possible. For example, the full ring 301, the U-shaped ring 401 and the line 501 can each be continuous or segmented and they can be provided in varying combinations with each other. For example, two U-shaped rings 401 can be provided in combination with one another with one in a non-inverted configuration and one in an inverted configuration to form a nearly full ring with two open sections. Likewise, a line 501 can be combined with either the full ring 301 or the U-shaped ring 401 in an overlapping configuration to form a shield formation. Similarly, multiple lines 501 can be provided in an overlapping shoulder-to-shoulder configuration to form another type of shield formation. Further complex, nested, regular, and irregular shapes can also be provided.

In any case, in accordance with one or more embodiments of the present invention, a default width of the full ring 301, the U-shaped ring 401 and the line 501 can be about 50 μm. This default width can be increased or decreased based on various factors such as application, available real estate, and voltage (IR) sensitivity determinations.

Figure 6:
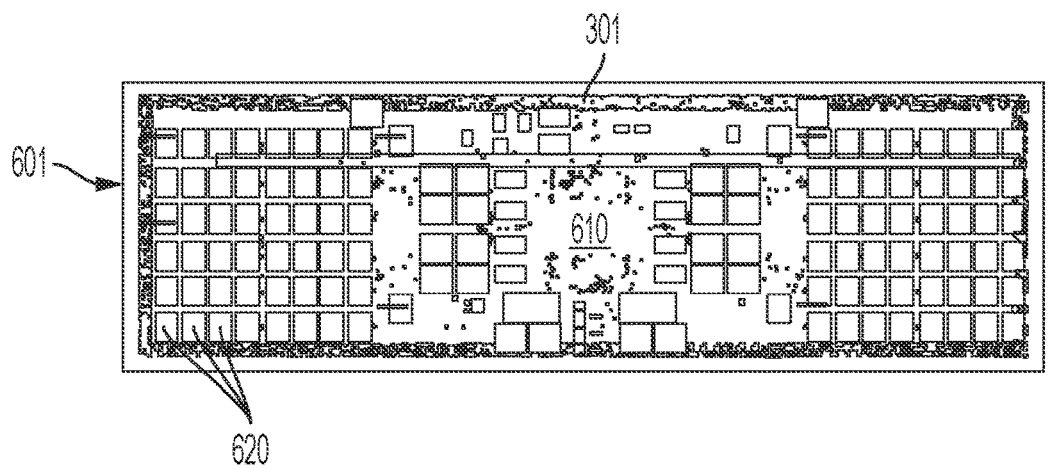
FIG. 6 is a top-down view of a detailed HLBS structure with a full ring of filler elements and decoupling capacitors in accordance with one or more embodiments of the present invention.
Figure 7:
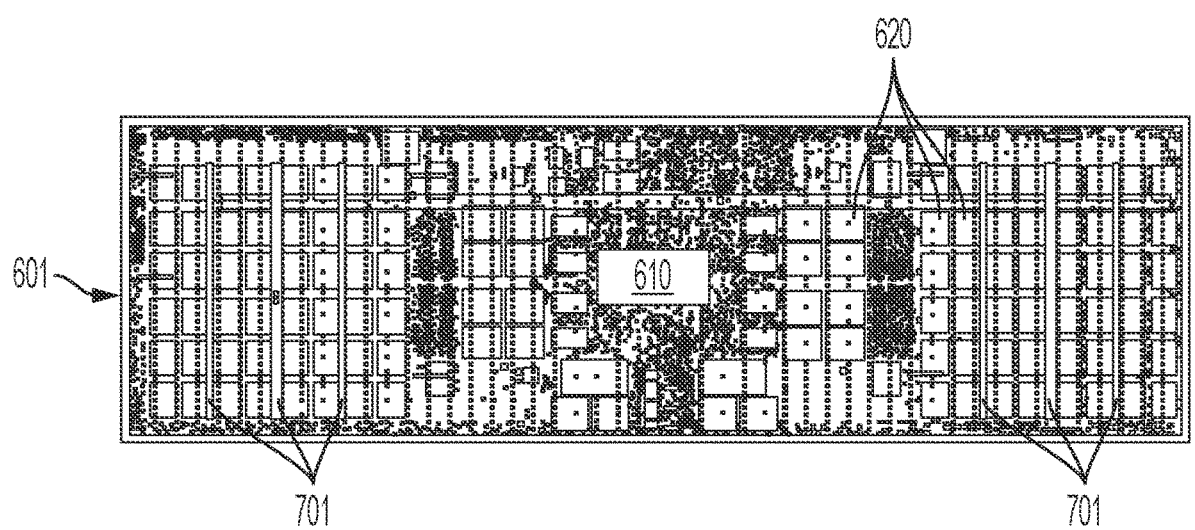
FIG. 7 is a top-down view of a detailed HLBS structure with linear arrays of decoupling capacitors in accordance with one or more embodiments of the present invention.

With reference to FIGS. 6 and 7, top-down views of an HLBS structure 601 are shown and illustrate the full ring 301 of FIG. 3 (see FIG. 6, shown without the linear arrays) and linear arrays 701 of the decoupling capacitors of the relatively large sizes (see FIG. 7, shown without the full ring of FIGS. 3 and 6). As shown in FIGS. 6 and 7, the HLBS structure 601 includes a base substrate 610 and multitudes of ECO books 620 arrayed throughout the available space of the surface of the base substrate 610.

Figure 8:
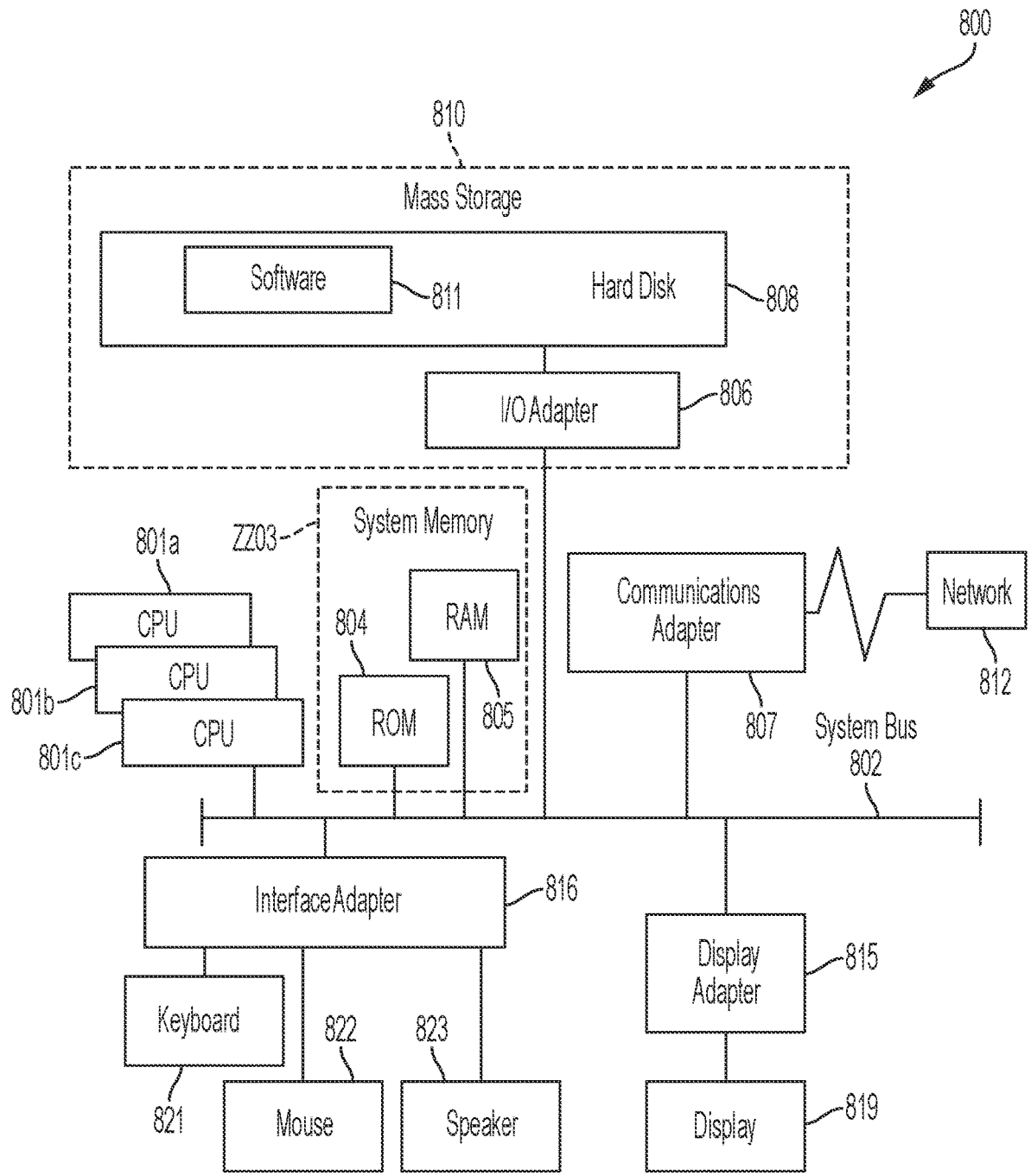
FIG. 8 is a schematic diagram of a computer system for executing a method of updating branch prediction in accordance with one or more embodiments of the present invention.

Turning now to FIG. 8, a computer system 800 is generally shown in accordance with an embodiment. The computer system 800 can be an electronic, computer framework comprising and/or employing any number and combination of computing devices and networks utilizing various communication technologies, as described herein. The computer system 800 can be easily scalable, extensible, and modular, with the ability to change to different services or reconfigure some features independently of others. The computer system 800 may be, for example, a server, desktop computer, laptop computer, tablet computer, or smartphone. In some examples, computer system 800 may be a cloud computing node. Computer system 800 may be described in the general context of computer system executable instructions, such as program modules, being executed by a computer system. Generally, program modules may include routines, programs, objects, components, logic, data structures, and so on that perform particular tasks or implement particular abstract data types. Computer system 800 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 8, the computer system 800 has one or more central processing units (CPU(s)) 801a, 801b, 801c, etc. (collectively or generically referred to as processor(s) 801). The processors 801 can be a single-core processor, multi-core processor, computing cluster, or any number of other configurations. The processors 801, also referred to as processing circuits, are coupled via a system bus 802 to a system memory 803 and various other components. The system memory 803 can include a read only memory (ROM) 804 and a random access memory (RAM) 805. The ROM 804 is coupled to the system bus 802 and may include a basic input/output system (BIOS), which controls certain basic functions of the computer system 800. The RAM is read-write memory coupled to the system bus 802 for use by the processors 801. The system memory 803 provides temporary memory space for operations of said instructions during operation. The system memory 803 can include random access memory (RAM), read only memory, flash memory, or any other suitable memory systems.

The computer system 800 comprises an input/output (I/O) adapter 806 and a communications adapter 807 coupled to the system bus 802. The I/O adapter 806 may be a small computer system interface (SCSI) adapter that communicates with a hard disk 808 and/or any other similar component. The I/O adapter 806 and the hard disk 808 are collectively referred to herein as a mass storage 810.

Software 811 for execution on the computer system 800 may be stored in the mass storage 810. The mass storage 810 is an example of a tangible storage medium readable by the processors 801, where the software 811 is stored as instructions for execution by the processors 801 to cause the computer system 800 to operate, such as is described herein below with respect to the various Figures. Examples of computer program product and the execution of such instruction is discussed herein in more detail. The communications adapter 807 interconnects the system bus 802 with a network 812, which may be an outside network, enabling the computer system 800 to communicate with other such systems. In one embodiment, a portion of the system memory 803 and the mass storage 810 collectively store an operating system, which may be any appropriate operating system, such as the z/OS or AIX operating system from IBM Corporation, to coordinate the functions of the various components shown in FIG. 8.

Additional input/output devices are shown as connected to the system bus 802 via a display adapter 815 and an interface adapter 816 and. In one embodiment, the adapters 806, 807, 815, and 816 may be connected to one or more I/O buses that are connected to the system bus 802 via an intermediate bus bridge (not shown). A display 819 (e.g., a screen or a display monitor) is connected to the system bus 802 by a display adapter 815, which may include a graphics controller to improve the performance of graphics intensive applications and a video controller. A keyboard 821, a mouse 822, a speaker 823, etc. can be interconnected to the system bus 802 via the interface adapter 816, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 8, the computer system 800 includes processing capability in the form of the processors 801, and, storage capability including the system memory 803 and the mass storage 810, input means such as the keyboard 821 and the mouse 822, and output capability including the speaker 823 and the display 819.

In some embodiments, the communications adapter 807 can transmit data using any suitable interface or protocol, such as the internet small computer system interface, among others. The network 812 may be a cellular network, a radio network, a wide area network (WAN), a local area network (LAN), or the Internet, among others. An external computing device may connect to the computer system 800 through the network 812. In some examples, an external computing device may be an external webserver or a cloud computing node.

It is to be understood that the block diagram of FIG. 8 is not intended to indicate that the computer system 800 is to include all of the components shown in FIG. 8. Rather, the computer system 800 can include any appropriate fewer or additional components not illustrated in FIG. 8 (e.g., additional memory components, embedded controllers, modules, additional network interfaces, etc.). Further, the embodiments described herein with respect to computer system 800 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 9:
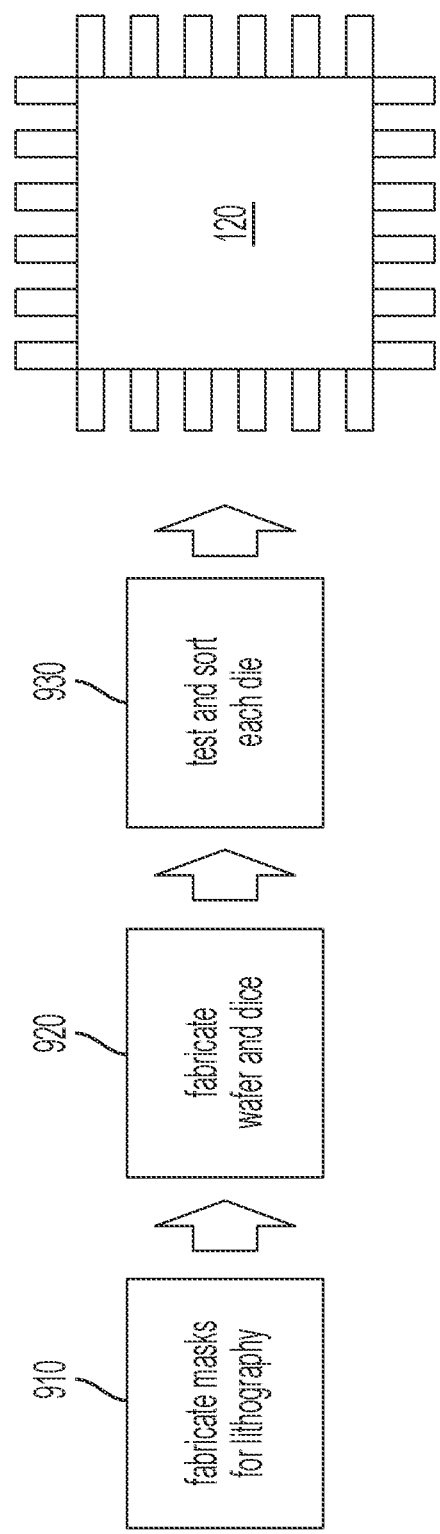
FIG. 9 is a process flow of a method of fabricating an integrated circuit according to exemplary embodiments of the invention.

FIG. 9 is a process flow of a method of fabricating an integrated circuit according to exemplary embodiments of the invention. Once the physical design data is obtained, based, in part, on the computer-implemented method of updating branch prediction described herein, the integrated circuit 120 can be fabricated according to known processes that are generally described with reference to FIG. 9. Generally, a wafer with multiple copies of the final design is fabricated and cut (i.e., diced) such that each die is one copy of the integrated circuit 120. At block 910, the processes include fabricating masks for lithography based on the finalized physical layout. At block 920, fabricating the wafer includes using the masks to perform photolithography and etching. Once the wafer is diced, testing and sorting each die is performed, at block 930, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method of hierarchical large block synthesis (HLBS), comprising:

creating at least a partial ring around an HLBS structure to comprise at least one or more filler elements, which are engineering change order (ECO) books for adding repeaters to wire dominated nets, and decoupling capacitors of relatively large sizes;

identifying certain areas of the HLBS structure within the partial ring that exhibit a unique characteristic;

disposing decoupling capacitors of the relatively large sizes in the certain areas; and filling a remainder of the areas of the HLBS structure with engineering change order (ECO) books and decoupling capacitors of relatively small sizes.

2. The computer-implemented method according to claim 1, wherein the creating of at least the partial ring comprises creating a full ring around the HLBS structure.

3. The computer-implemented method according to claim 1, wherein the partial ring has an open section.

4. The computer-implemented method according to claim 1, wherein the unique characteristic comprises a voltage (IR) sensitivity.

5. The computer-implemented method according to claim 1, wherein the decoupling capacitors of the relatively large sizes are about 0.96 µm×0.648 µm or larger and the decoupling capacitors of the relatively small sizes are about 0.96 µm×0.324 µm.

6. The computer-implemented method according to claim 1, wherein the disposing of the decoupling capacitors of the relatively large sizes in the certain areas comprises forming linear arrays of the decoupling capacitors of the relatively large sizes.

7. The computer-implemented method according to claim 6, wherein the linear arrays extend from opposite sides of the partial ring.

8. A computer program product for hierarchical large block synthesis (HLBS), the computer program product comprising:

a memory; and a processing system configured to perform a method comprising:

creating at least a partial ring around an HLBS structure to comprise at least one or more of filler elements, which are engineering change order (ECO) books for adding repeaters to wire dominated nets, and decoupling capacitors of relatively large sizes;

identifying certain areas of the HLBS structure within the partial ring that exhibit a unique characteristic;

disposing decoupling capacitors of the relatively large sizes in the certain areas; and filling a remainder of the areas of the HLBS structure with engineering change order (ECO) books and decoupling capacitors of relatively small sizes.

9. The computer program product according to claim 8, wherein the creating of at least the partial ring comprises creating a full ring around the HLBS structure.

10. The computer program product according to claim 8, wherein the creating of at least the partial ring comprises creating one or more of a U-shape, an L-shape and a line at least partially around or along a section of the HLBS structure.

11. The computer program product according to claim 8, wherein the unique characteristic comprises a voltage (IR) sensitivity.

12. The computer program product according to claim 8, wherein the decoupling capacitors of the relatively large sizes are about 0.96 µm×0.648 µm or larger and the decoupling capacitors of the relatively small sizes are about 0.96 µm×0.324 µm.

13. The computer program product according to claim 8, wherein the disposing of the decoupling capacitors of the relatively large sizes in the certain areas comprises forming linear arrays of the decoupling capacitors of the relatively large sizes.

14. The computer program product according to claim 13, wherein the linear arrays extend from opposite sides of the partial ring.

15. A system for hierarchical large block synthesis (HLBS), comprising:

a memory having computer readable instructions; and one or more processors for executing the computer readable instructions, the computer readable instructions controlling the one or more processors to perform operations comprising:

creating at least a partial ring around an HLBS structure to comprise at least one or more of filler elements, which are engineering change order (ECO) books for adding repeaters to wire dominated nets, and decoupling capacitors of relatively large sizes;

identifying certain areas of the HLBS structure within the partial ring that exhibit a unique characteristic;

disposing decoupling capacitors of the relatively large sizes in the certain areas; and filling a remainder of the areas of the HLBS structure with engineering change order (ECO) books and decoupling capacitors of relatively small sizes.

16. The system according to claim 15, wherein the creating of at least the partial ring comprises creating a full ring around the HLBS structure.

17. The system according to claim 15, wherein the creating of at least the partial ring comprises creating one or more of a U-shape, an L-shape and a line at least partially around or along a section of the HLBS structure.

18. The system according to claim 15, wherein the unique characteristic comprises a voltage (IR) sensitivity.

19. The system according to claim 15, wherein the decoupling capacitors of the relatively large sizes are about 0.96 µm×0.648 µm or larger and the decoupling capacitors of the relatively small sizes are about 0.96 µm×0.324 µm.

20. The system according to claim 15, wherein the disposing of the decoupling capacitors of the relatively large sizes in the certain areas comprises forming linear arrays of the decoupling capacitors of the relatively large sizes that extend from opposite sides of the partial ring.

* * * * *